United States Patent [19]

Shou et al.

[11] Patent Number: 5,452,336
[45] Date of Patent: Sep. 19, 1995

[54] MEMORY DEVICE FOR RECORDING A TIME FACTOR

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 151,030

[22] Filed: Nov. 12, 1993

[30] Foreign Application Priority Data

Nov. 13, 1992 [JP] Japan .................. 4-328766

[51] Int. Cl.⁶ .................. H03K 21/02; H03K 17/30
[52] U.S. Cl. .................. 377/55; 377/20; 327/398; 327/279
[58] Field of Search .................. 377/20, 55; 307/602, 307/603; 327/279, 398

[56] References Cited

U.S. PATENT DOCUMENTS

| | | | |
|---|---|---|---|
| 4,009,443 | 2/1977 | Coulter et al. | 377/55 |
| 4,633,491 | 12/1986 | Kuhnel | 377/20 |
| 5,128,973 | 7/1992 | Sasaki et al. | 377/20 |

OTHER PUBLICATIONS

Pulse, Digital & Switching, Waveforms by Millman & Taub p. 315 (FIG. 9–7) Copyright 1965.
Pricer, David, "Integrated Circuits", The Electrical Engineering Handbook, 1993, pp. 1651–1657.

*Primary Examiner*—John S. Heyman
*Attorney, Agent, or Firm*—Cushman, Darby & Cushman

[57] ABSTRACT

A memory device for recording a time factor of data includes a threshold element, coupling capacitance, an RC-circuit, and a digital counter. A reference voltage is input to the RC-circuit. The output of the RC-circuit and an input voltage are each input to the coupling capacitance. The output of the coupling capacitance is input to the threshold element. When the voltage received by the threshold element reaches a threshold voltage level, the threshold element generates an output voltage. The digital counter receives the threshold element output voltage and the reference voltage. The digital counter is triggered by the reference voltage to begin counting clock pulses generated by a reference clock. The digital counter is then triggered by the threshold element output voltage to stop counting the clock pulses.

2 Claims, 1 Drawing Sheet

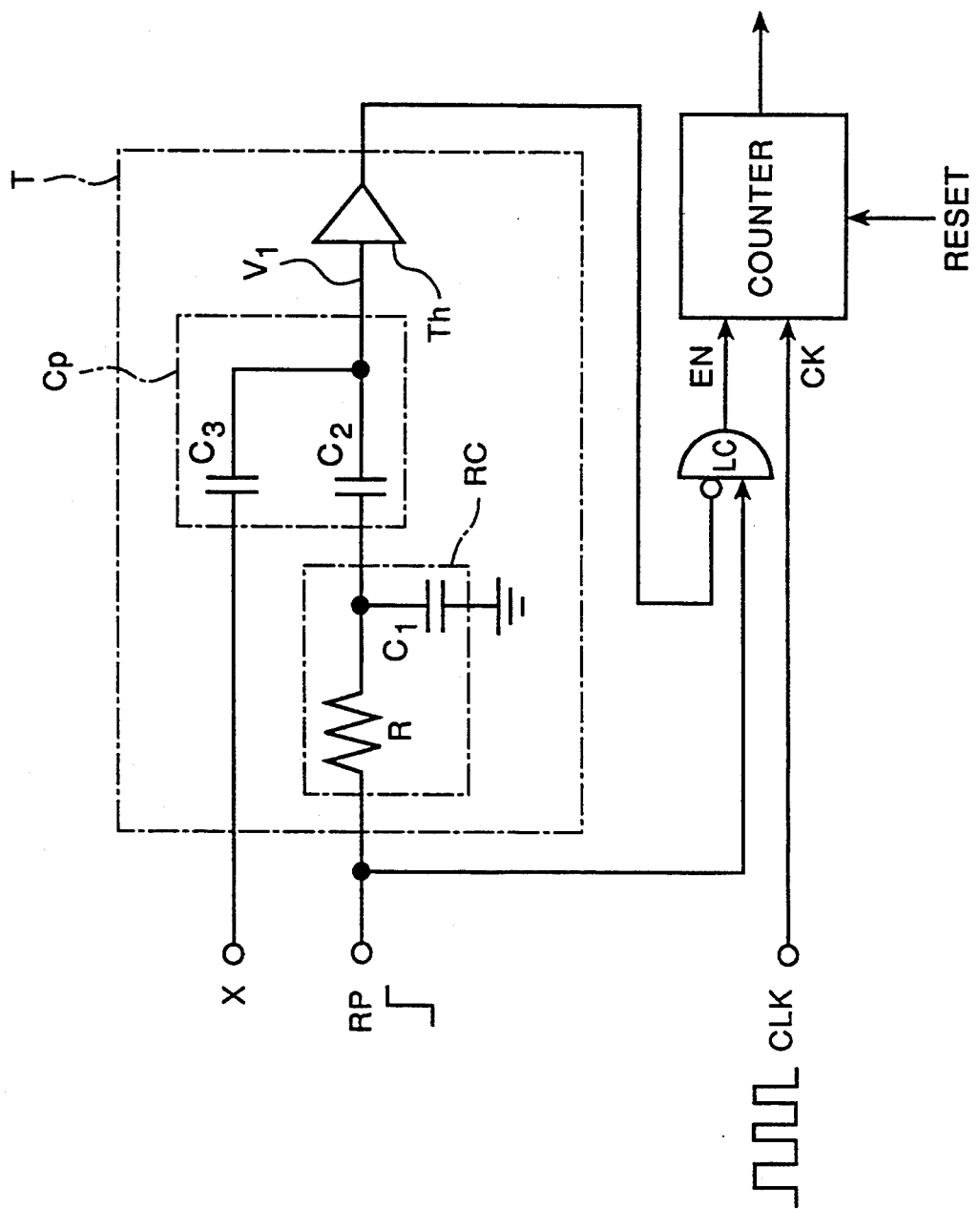

MEMORY DEVICE FOR RECORDING A TIME FACTOR

FIELD OF THE INVENTION

The present invention relates to a memory device.

BACKGROUND OF THE INVENTION

Conventionally, a memory device is used to store voltage levels representing digital information. It has become necessary for a memory device to process multilevel information because of limitations. Multi-valued computation is difficult for the conventional digital circuit. The inventors of the present invention have proposed a circuit for converting analog voltage into a function of time by an exponential using an RC circuit. In the time domain, multiplication and division of the analog voltage is expressed by an addition and subtraction. It is necessary to hold data for the calculation above, however, there is no such memory means.

SUMMARY OF THE INVENTION

The present invention solves the above conventional problems and has an object to provide a memory device in which a time element can be registered.

A memory device of the present invention works by: i) setting an offset corresponding to a time constant of a RC-circuit using an input voltage, ii) driving a threshold element using charged voltage from a capacitance in the RC-circuit, iii) using an output of the threshold element as a stop signal of a digital counter, and using a referential voltage input as a start signal of the digital counter, and iv) storing the time from the start signal to the stop signal in the digital counter as a digital count value.

BRIEF DESCRIPTION OF THE DRAWINGS

The drawing shows a diagram of a circuit of an embodiment of a memory cell in the memory device according to the present invention.

PREFERRED EMBODIMENT OF THE PRESENT INVENTION

Hereinafter, an embodiment of the memory device according to the present invention is described with reference to the attached drawings, In the drawing the memory device comprises threshold element "Th" for outputting output voltage when its gate voltage reaches the threshold voltage. "Cp" the connection of two-inputs capacity. The output of "Cp" is connected to the gate of "Th", and one of the two inputs of it is connected to RC-circuit ("RC", hereafter). Timer "T" is constructed by "Th", "Cp" and "RC".

A referential voltage input "RP" is input to resistance "R" of RC. One terminal of capacitance "$C_1$" of "RC" is connected to "R" and "Cp", and another terminal of it is grounded. Another input of "Cp" is connected to input voltage "X".

Assuming the capacitances of "Cp" to be "$C_2$" and "$C_3$", and the output voltage to be "$V_1$", formula (1) is true.

$$V_1 = [C_3 X + C_2\{1-\exp(t/(RC_1))\}]/(C_2+C_3) \qquad (1)$$

When "$V_1$" reaches to the "$Vt_1$", the threshold voltage of "Th", "Th" generates output voltage "$V_m$" (source voltage). "RP" reaches "$V_m$" in the step-like way, where charging of "RC" is started, and "$V_1$" becomes equal to "$Vt_1$" ($V_1 = Vt_1$) on "tx" of the time corresponding to (see Formula 2 below) "X".

$$Vt_1 = [C_3 X + C_2\{1-\exp(-tx/(RC_1))\}]/(C_2+C_3) \qquad (2)$$

Note that "tx" of the time according to "X" can be obtained by formula (2).

When the time "tx" is preserved in some way, the object of this invention is achieved.

"RP", the referential voltage input above, is connected to "RC". It may also be connected to an input terminal of logic circuit "LC". An output terminal of "Th" is connected to another input terminal of logic circuit "LC". An output terminal of "LC" is connected to a digital counter. Logic circuit "LC" generates an output only when an input from "RP" is high level.

When "RP" reaches "$V_m$" in step-way, logic circuit "LC" generates an output so that an enable terminal of a digital counter becomes a high level. The digital counter starts counting clock-pulse incident to it. That is, referential voltage input "RP" is input to the digital counter as a start signal.

While "RP" is high. "RC" is charging. "$V_1$" becomes equal to "$Vt_1$" ($V_1 = Vt_1$) at time "tx" which is correspondent to input voltage X. At that time, the threshold element generates output voltage "$V_m$" and logic circuit "LC" stops outputting. Therefore, the output of threshold element "Th" is the stop signal of the digital counter.

Accordingly, the digital counter counts time "tx" from the input of start signal to the input of stop signal using clock pulses and can preserve it as a digital count value.

A memory device of the present invention works by setting an offset corresponding to a time constant of a RC-circuit using input voltage, driving a threshold element applying a charged voltage to a capacitance in the RC-circuit, using an output of threshold element as a stop signal for a digital counter, while using an input referential voltage as a start signal for the digital counter, and storing the time from the start signal to the stop signal in the digital counter as a digital count value. Therefore, it is possible to provide a memory device in which time factor can be registered.

What is claimed is:

1. A memory device comprising:
   an RC-circuit comprising a resistance and a capacitance, said RC-circuit receiving a reference voltage for charging said capacitance based on a predetermined time constant, said RC-circuit generating an RC-circuit output voltage corresponding to said charged voltage of said capacitance;
   a coupling capacitance having a first input and a second input, said first input receiving said RC-circuit output voltage and said second input receiving an external input voltage, said coupling capacitance generating an output voltage;
   a threshold element for generating a stop signal when said output voltage generated by said coupling capacitance reaches a threshold voltage level; and
   counting means for counting a number of pulses, said counting means being enabled by said reference voltage and said counting means being disabled by said stop signal generated by said threshold element.

2. A memory device comprising:

an RC-circuit comprising a resistance and a capacitance, said RC-circuit receiving a reference voltage for charging said capacitance based on a predetermined time constant, said RC-circuit generating an RC-circuit output voltage corresponding to said charged voltage of said capacitance;

a coupling capacitance having a first input and a second input, said first input receiving said RC-circuit output voltage and said second input receiving an external input voltage, said coupling capacitance generating an output voltage;

a threshold element for generating a stop signal when said output voltage generated by said coupling capacitance reaches a threshold voltage level; and counting means for counting a number of pulses generated by an external source, said counting means being enabled by said reference voltage and said counting means being disabled by said stop signal generated by said threshold element.

* * * * *